United States Defensive Publication [19] (H) [11] T988,007

Drew et al. [43] Nov. 6, 1979

[54] LASER DEPOSITION OF METAL UPON TRANSPARENT MATERIALS

[75] Inventors: Roland F. Drew, Poughkeepsie; Frank J. Schmidt, Jr., Highland Falls; Thomas J. Vanduynhoven, Poughkeepsie, all of N.Y.

[73] Assignee: International Business Machines Corporation, Armonk, N.Y.

[21] Appl. No.: 9,704

[22] Filed: Feb. 5, 1979

Related U.S. Application Data

[63] Continuation of Ser. No. 862,797, Dec. 21, 1977, abandoned.

[51] Int. Cl.[2] ..... B05D 3/06

[52] U.S. Cl. ..... 427/53.1

[57] ABSTRACT

The present invention contemplates a method and apparatus for selectively depositing metal or other materials upon a transparent substrate utilizing a laser source. More particularly, the invention contemplates depositing material in highly selective areas with a high degree of adhesion and uniformity.

The invention attains these results with an arrangement wherein a laser source 12 is located on one side of a transparent or translucent substrate 18 upon which metal is to be deposited, so that the laser beam can be directed through the substrate. A reservoir 20 of metal is located on supports 24 on the opposite side of the substrate adjacent to the surface thereof. Deflection means 14, 16 are provided to selectively scan the laser beam at predetermined intensity levels over a desired pattern.

The scanned laser beam acts to heat and vaporize metal from the metal reservoir, which is then redeposited upon the adjacent surface of the glass substrate. It has been found that with transparent substrates, metal and particularly conductive metal can be redeposited upon one surface thereof using this method with a high degree of adhesion and uniformity.

5 Claims, 1 Sheet Drawing,

11 Pages Specification

The file of this unexamined application may be inspected and copies thereof may be purchased (849 O.G. 1221, Apr. 9, 1968).

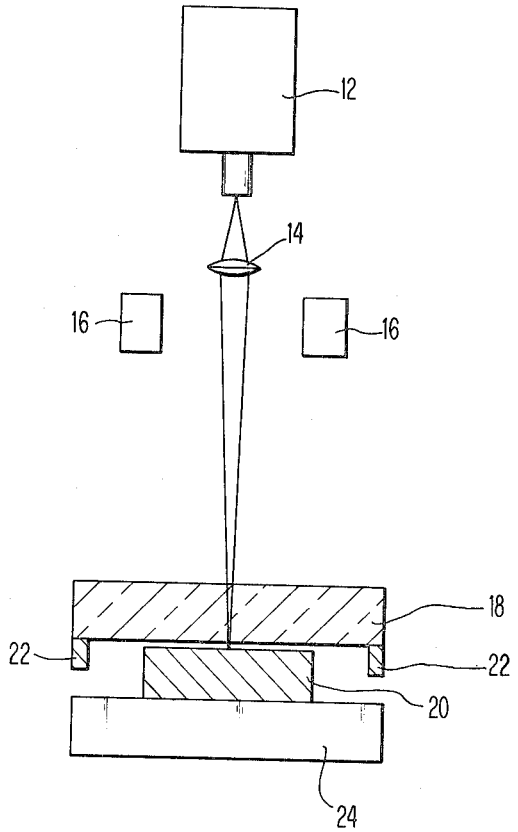

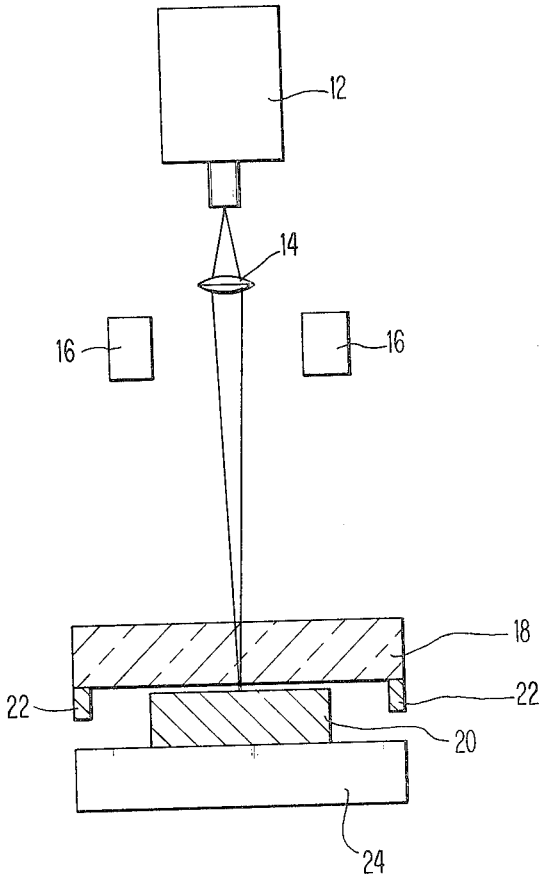
12
14
16
16
18
22
22
20
24